（12） United States Patent
Kim (10) Patent No.: US 10,553,833 B2
(45) Date of Patent: Feb. 4, 2020

(54) ORGANIC LIGHT EMITTING DIODE DISPLAY AND METHOD FOR MANUFACTURING ORGANIC LIGHT EMITTING DIODE DISPLAY

(71) Applicant: Samsung Display Co., Ltd., Yongin-si, Gyeonggi-do (KR)

(72) Inventor: Young Il Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/976,575

(22) Filed: May 10, 2018

(65) Prior Publication Data

US 2019/0123307 A1  Apr. 25, 2019

(30) Foreign Application Priority Data

Oct. 24, 2017  (KR) .................. 10-2017-0138544

(51) Int. Cl.
*H01L 51/00* (2006.01)
*H01L 51/56* (2006.01)
*H01L 27/32* (2006.01)
*H01L 51/50* (2006.01)

(52) U.S. Cl.
CPC .......... *H01L 51/56* (2013.01); *H01L 27/3223* (2013.01); *H01L 27/3246* (2013.01); *H01L 51/0012* (2013.01); *H01L 51/5012* (2013.01); *H01L 2227/323* (2013.01)

(58) Field of Classification Search
CPC ............ H01L 27/3223; H01L 27/3246; H01L 51/0012; H01L 51/50; H01L 51/56
See application file for complete search history.

(56) References Cited

U.S. PATENT DOCUMENTS

| 2017/0263564 A1* | 9/2017 | Kim ..................... H01L 51/0012 |
| 2018/0210576 A1* | 7/2018 | Zhang ..................... G06F 3/044 |
| 2018/0219123 A1* | 8/2018 | Wang ..................... H01L 27/15 |

FOREIGN PATENT DOCUMENTS

| GB | 2 379 412 A | 3/2003 |
| JP | 4145791 B2 | 9/2008 |
| KR | 10-0815761 B1 | 3/2008 |

* cited by examiner

*Primary Examiner* — Cuong Q Nguyen
(74) *Attorney, Agent, or Firm* — Lewis Roca Rothgerber Christie LLP (57) ABSTRACT

An organic light emitting diode display and a method for manufacturing an organic light emitting diode display are provided. An organic light emitting diode display includes: a substrate; a plurality of organic light emitting elements positioned on the substrate; a first alignment mark positioned between the plurality of organic light emitting elements; and a first organic pattern overlapping the first alignment mark on the substrate and including a same material as an organic material included in the plurality of organic light emitting elements.

13 Claims, 6 Drawing Sheets

ORGANIC LIGHT EMITTING DIODE DISPLAY AND METHOD FOR MANUFACTURING ORGANIC LIGHT EMITTING DIODE DISPLAY

CROSS-REFERENCE TO RELATED APPLICATION

This application claims priority to and the benefit of Korean Patent Application No. 10-2017-0138544, filed on Oct. 24, 2017 in the Korean Intellectual Property Office, the entire content of which is incorporated herein by reference.

BACKGROUND

1. Field

Aspects of embodiments of the present disclosure relate to an organic light emitting diode display and a method for manufacturing an organic light emitting diode display.

2. Description of the Related Art

Generally, examples of display devices include an organic light emitting diode (OLED) display, a liquid crystal display (LCD), and a plasma display panel (PDP).

Among them, the organic light emitting diode display includes a plurality of organic light emitting elements positioned on a substrate.

The organic light emitting elements include a first electrode, an organic emissive layer, and a second electrode, and the organic emissive layer may be formed by coating an organic material on the first electrode.

The above information disclosed in this Background section is only for enhancement of understanding of the background of the invention and, therefore, it may contain information that does not form the prior art that is already known in this country to a person of ordinary skill in the art.

SUMMARY

According to aspects of embodiments, an organic light emitting diode display in which an organic emissive layer is positioned at a correct position, and a method for manufacturing an organic light emitting diode display, are provided.

According to an aspect of one or more embodiments, an organic light emitting diode display includes: a substrate; a plurality of organic light emitting elements positioned on the substrate; a first alignment mark positioned between the plurality of organic light emitting elements; and a first organic pattern overlapping the first alignment mark on the substrate and including a same material as an organic material included in the plurality of organic light emitting elements.

Each of the plurality of organic light emitting elements may include: a first electrode positioned on the substrate; an organic emissive layer positioned on the first electrode and including the organic material; and a second electrode positioned on the organic emissive layer.

The organic light emitting diode display may further include a pixel definition layer covering at least a part of the first electrode and including a plurality of openings respectively overlapping with the plurality of organic light emitting elements, and the first alignment mark and the first organic pattern may be positioned between the plurality of openings.

The first alignment mark may be positioned between the substrate and the pixel definition layer.

The first alignment mark may be positioned on a same layer as the first electrode.

The organic light emitting diode display may further include a thin film transistor including an active layer positioned between the substrate and the first electrode and positioned on the substrate, a gate electrode positioned on the active layer, and a source electrode, and a drain electrode positioned on the gate electrode, and the first alignment mark may be positioned on a same layer as at least one among the active layer, the gate electrode, the source electrode, and the drain electrode.

The first organic pattern may be positioned on the pixel definition layer.

The substrate may include a display area in which the plurality of organic light emitting elements is positioned, and a non-display area adjacent to the display area, and the organic light emitting diode display may further include a second alignment mark positioned at the non-display area, and a second organic pattern overlapping the second alignment mark and including the same material as the first organic pattern.

The second alignment mark may include a first sub-alignment mark and a second sub-alignment mark separated from each other by the display area.

The first alignment mark and the second alignment mark may have a same shape in a plane.

According to an aspect of one or more embodiments, a method for manufacturing an organic light emitting diode display includes: providing a pretreated substrate including a substrate, a plurality of first electrodes positioned on the substrate, a pixel definition layer including a plurality of openings overlapping with the plurality of first electrodes, and a first alignment mark positioned between the plurality of openings; coating an organic material on the plurality of first electrodes exposed by the plurality of openings by using a nozzle, and coating the organic material on the pixel definition layer overlapping the first alignment mark; and confirming whether the organic material is aligned with the first alignment mark.

The method may further include adjusting a position of the nozzle.

The substrate may include a display area where the plurality of first electrodes is positioned, and a non-display area adjacent to the display area, the pretreated substrate may further include a second alignment mark positioned at the non-display area, and the method may further include: coating the organic material on the pixel definition layer overlapping the second alignment mark by using the nozzle; and confirming whether the organic material is aligned with the second alignment mark.

According to aspects of exemplary embodiments, the organic light emitting diode display in which the organic emissive layer is disposed at the correct position and the manufacturing method thereof are provided.

DESCRIPTION OF SYMBOLS

SUB: substrate; OLED: organic light emitting elements; AM1: first alignment mark PA1: first organic pattern

DETAILED DESCRIPTION

The present invention will be described more fully herein with reference to the accompanying drawings, in which some exemplary embodiments of the invention are shown. As those skilled in the art would realize, the described embodiments may be modified in various different ways, all without departing from the spirit or scope of the present invention.

In order to clearly explain the present invention, parts that are not directly related to the present invention may be omitted, and the same reference numerals are used in connection with same or similar constituent elements throughout the specification.

In addition, the size and thickness of each element shown in the drawings may be arbitrarily shown for better understanding and ease of description, and the present invention is not limited thereto. In the drawings, the thickness of layers, films, panels, regions, etc., may be exaggerated for clarity. In the drawings, for better understanding and ease of description, the thicknesses of some layers and areas may be exaggerated.

It is to be understood that when an element, such as a layer, film, region, or substrate, is referred to as being "on" another element, it can be directly on the other element or one or more intervening elements may also be present. In contrast, when an element is referred to as being "directly on" another element, there are no intervening elements present. Further, in the specification, the words "on" or "above" mean positioned on or below the object portion, and do not necessarily mean positioned on the upper side of the object portion based on a gravitational direction.

In addition, unless explicitly described to the contrary, the word "comprise" and variations, such as "comprises" or "comprising," are to be understood to imply the inclusion of stated elements but not the exclusion of any other elements.

Now, an organic light emitting diode display according to an exemplary embodiment will be described with reference to FIG. 1 to FIG. 3.

Figure 1:
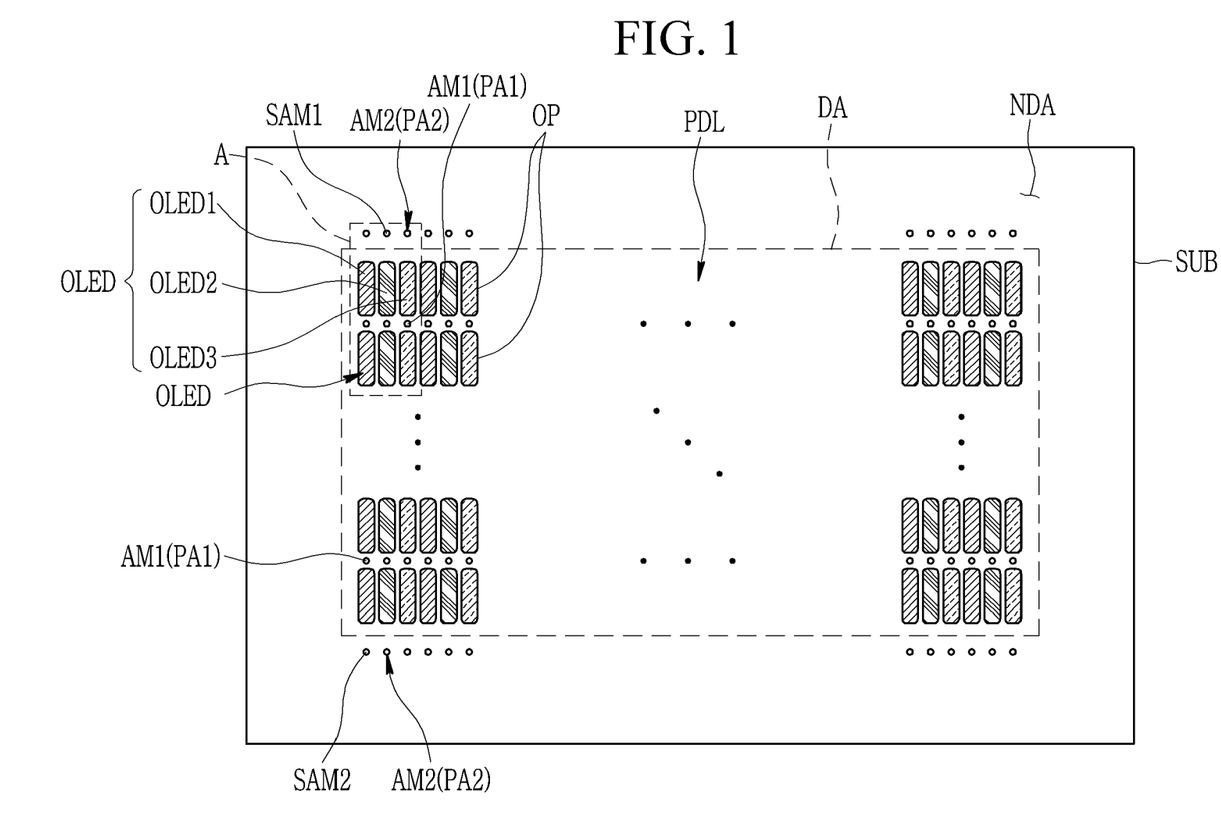
FIG. 1 is a top plan view showing an organic light emitting diode display according to an exemplary embodiment.

FIG. 1 is a top plan view showing an organic light emitting diode display according to an exemplary embodiment; FIG. 2 is a top plan view showing a region "A" of FIG. 1; and FIG. 3 is a cross-sectional view taken along the line III-III of FIG. 2.

Figure 2:
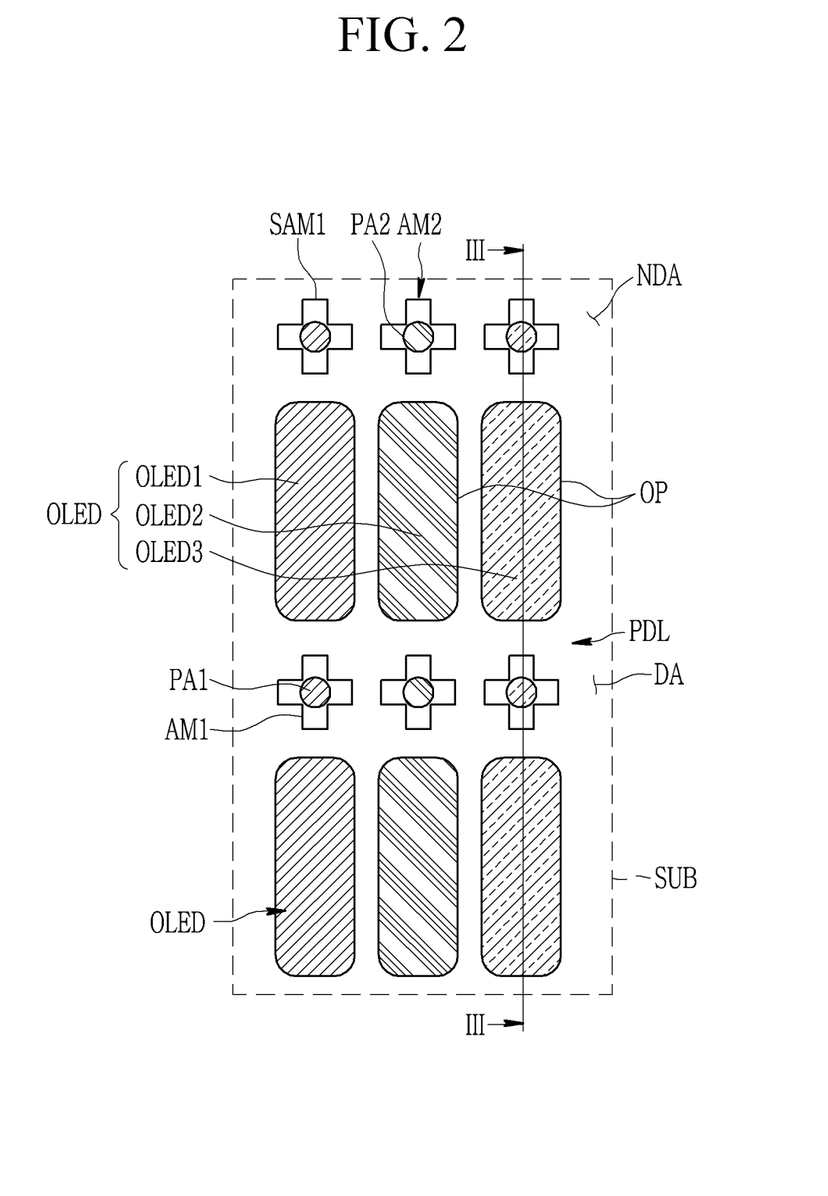
FIG. 2 is a top plan view showing a region "A" of FIG. 1.
Figure 3:
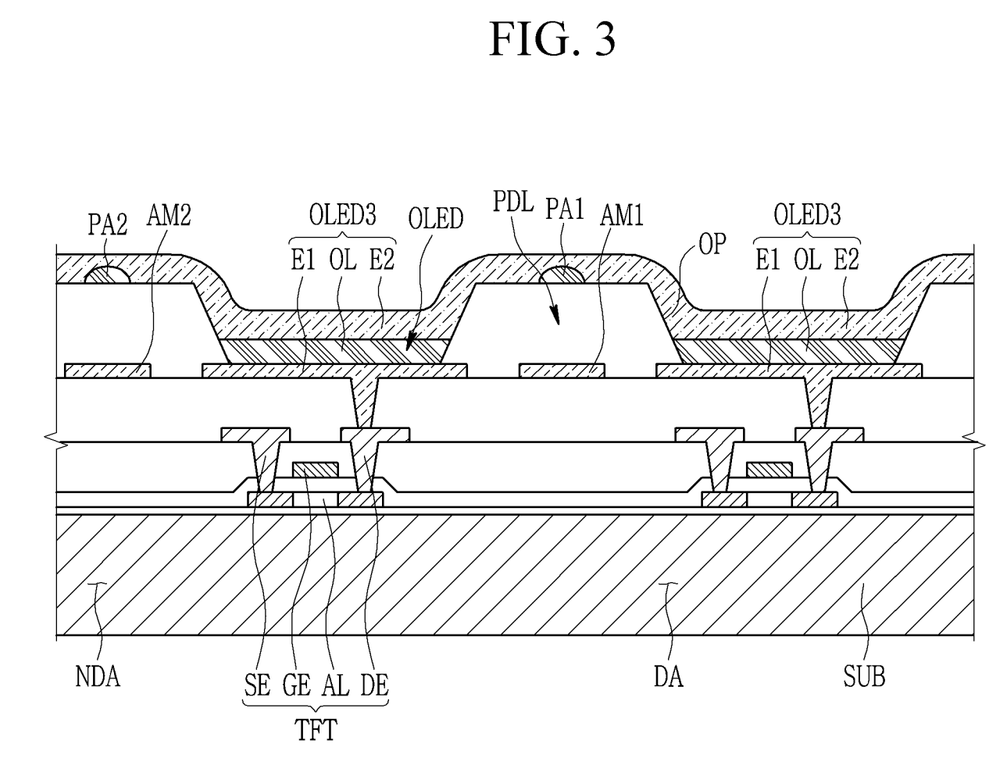
FIG. 3 is a cross-sectional view taken along the line III-Ill of FIG. 2.

Referring to FIG. 1 to FIG. 3, an organic light emitting diode display according to an exemplary embodiment includes a substrate SUB, a thin film transistor TFT, a plurality of organic light emitting elements OLED, a pixel definition layer PDL, a first alignment mark AM1, a first organic pattern PA1, a second alignment mark AM2, and a second organic pattern PA2.

The substrate SUB may include any of various materials, such as an organic material such as a polymer, glass, and an inorganic material. The substrate SUB may be rigid or flexible.

The substrate SUB includes a display area DA in which the plurality of organic light emitting elements OLED are positioned and a non-display area NDA adjacent to the display area DA, and the non-display area NDA encloses at least part of the display area DA. In an embodiment, the display area DA may be positioned at a center area of the substrate SUB, and the non-display area NDA may be positioned at an outer area of the substrate SUB.

The thin film transistor TFT is shown in FIG. 3. The thin film transistor TFT is positioned between the substrate SUB and a first electrode E1 of the plurality of organic light emitting elements OLED. In an embodiment, the thin film transistor TFT includes an active layer AL positioned on the substrate SUB, a gate electrode GE positioned on the active layer AL, and a source electrode SE and a drain electrode DE positioned on the gate electrode GE and connected to the active layer AL.

There may be at least two thin film transistors TFT. The at least two thin film transistors TFT are connected to each other, thereby configuring various circuits. The thin film transistor TFT may transmit a signal to the first electrode E1 of the plurality of organic light emitting elements OLED.

The plurality of organic light emitting elements OLED is positioned at the display area DA of the substrate SUB. The plurality of organic light emitting elements OLED may be disposed in a matrix shape on a plane on the substrate SUB.

The plurality of organic light emitting elements OLED includes a first organic light emitting element OLED1, a second organic light emitting element OLED2, and a third organic light emitting element OLED3.

In an embodiment, the first organic light emitting element OLED1 emits red light, the second organic light emitting element OLED2 emits green light, and the third organic light emitting element OLED3 emits blue light; however, the present invention is not limited thereto.

For example, the first organic light emitting element OLED1, the second organic light emitting element OLED2, and the third organic light emitting element OLED3 may selectively emit red light, green light, and blue light, or white light.

Each of the first organic light emitting element OLED1, the second organic light emitting element OLED2, and the third organic light emitting element OLED3 includes a first electrode E1, an organic emissive layer OL, and a second electrode E2.

The first electrode E1 and the second electrode E2 may be a light reflective, light semi-transmissive, or light transmissive electrode. Each first electrode E1 of the first organic light emitting element OLED1, the second organic light emitting element OLED2, and the third organic light emitting element OLED3 is separated from each other, and, in an embodiment, the second electrodes E2 are connected in one plate shape.

The organic emissive layer OL includes an emissive layer (EL) including the organic material emitting light. The organic emissive layer OL may further include at least one among a hole injection layer (HIL), a hole transport layer (HTL), an electron transport layer (ETL), and an electron injection layer (EIL).

In an embodiment, the pixel definition layer PDL covers a part of the first electrode E1. For example, the pixel definition layer PDL covers an outer part of the first electrode E1, thereby defining each emission region of the first organic light emitting element OLED1, the second organic light emitting element OLED2, and the third organic light emitting element OLED3. The pixel definition layer PDL may include an organic material or the inorganic material, and may be formed of a single layer or a multilayer.

The pixel definition layer PDL includes a plurality of openings OP respectively overlapping with the first organic light emitting element OLED1, the second organic light emitting element OLED2, and the third organic light emitting element OLED3. The plurality of openings OP overlap each first electrode E1 of the first organic light emitting element OLED1, the second organic light emitting element OLED2, and the third organic light emitting element OLED3.

The first alignment mark AM1 is positioned between the plurality of organic light emitting elements OLED. In an embodiment, the first alignment mark AM1 may be a mask used when forming the organic emissive layer OL of the plurality of organic light emitting elements OLED.

The first alignment mark AM1 is positioned at the display area DA of the substrate SUB, and is respectively positioned between adjacent first organic light emitting elements OLED1, between adjacent second organic light emitting elements OLED2, and between adjacent third organic light emitting elements OLED3.

The first alignment mark AM1 is positioned between the plurality of openings OP of the pixel definition layer PDL and overlaps with the pixel definition layer PDL. In an embodiment, the first alignment mark AM1 is positioned having an island shape.

The first alignment mark AM1 is positioned between the substrate SUB and the pixel definition layer PDL, and the first alignment mark AM1 is covered by the pixel definition layer PDL.

In an embodiment, the first alignment mark AM1 is positioned on a same layer as the first electrode E1. In an embodiment, the first alignment mark AM1 is concurrently (e.g., simultaneously) formed with the first electrode E1, and includes the same material as the first electrode E1.

In another exemplary embodiment, the first alignment mark AM1 may be positioned on a same layer as at least one layer of the active layer AL, the gate electrode GE, the source electrode SE, and the drain electrode DE of the thin film transistor TFT, and may include the same material as at least one among the active layer AL, the gate electrode GE, the source electrode SE, and the drain electrode DE.

The first organic pattern PA1 is positioned at the display area DA of the substrate SUB and overlaps the first alignment mark AM1. The first organic pattern PA1 includes the same material as the organic material included in the plurality of organic light emitting elements OLED.

In an embodiment, the first organic pattern PA1 positioned between adjacent first organic light emitting elements OLED1 includes the same material as the emissive layer included in the organic emissive layer OL of the first organic light emitting element OLED1, the first organic pattern PA1 positioned between adjacent second organic light emitting elements OLED2 includes the same material as the emissive layer included in the organic emissive layer OL of the second organic light emitting element OLED2, and the first organic pattern PA1 positioned between adjacent third organic light emitting element OLED3 includes the same material as the emissive layer included in the organic emissive layer OL of the third organic light emitting element OLED3.

The first organic pattern PA1 is positioned on the pixel definition layer PDL. The first organic pattern PA1 overlaps the first alignment mark AM1 on the pixel definition layer PDL. In an embodiment, the first organic pattern PA1 has an island shape. The surface of the first organic pattern PA1 may be formed as a curved surface; however, the present invention is not limited thereto.

Figure 4A:
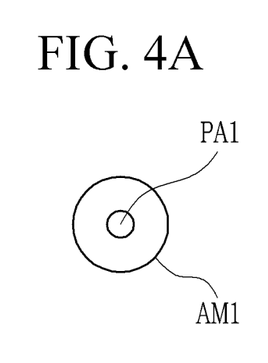
FIGS. 4A to 4C are top plan views showing examples of a first alignment mark and a first organic pattern.
Figure 4B:
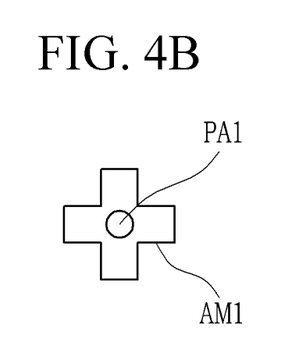
Figure 4C:
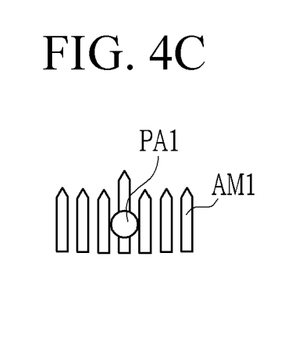

FIGS. 4A to 4C are top plan views showing examples of a first alignment mark and a first organic pattern.

Referring to FIGS. 4A to 4C, the first alignment mark AM1 may have a circular shape on a plane, like in FIG. 4A, may have a cross shape on a plane, like in FIG. 4B, or may have a shape of which a center lattice among a plurality of lattices has a longer length compared with other lattices, like in FIG. 4C.

In an embodiment, the first organic pattern PA1 may have a circular shape on a plane, like in FIGS. 4A, 4B, and 4C. The first organic pattern PA1 may be positioned at the center part of the first alignment mark AM1 on a plane.

Again referring to FIG. 1 to FIG. 3, the second alignment mark AM2 is positioned at the non-display area NDA of the substrate SUB. The second alignment mark AM2 may be positioned at an outside in each column direction of the first organic light emitting element OLED1, the second organic light emitting element OLED2, and the third organic light emitting element OLED3 on the substrate SUB. In an embodiment, the second alignment mark AM2 may have a same island shape as the first alignment mark AM1. The second alignment mark AM2 is positioned between the substrate SUB and the pixel definition layer PDL and may be covered by the pixel definition layer PDL.

In an embodiment, the second alignment mark AM2 may be positioned on the same layer as the first alignment mark AM1, and may include the same material as the first alignment mark AM1.

However, in another embodiment, the second alignment mark AM2 may be positioned on a different layer from the first alignment mark AM1, and/or may include a different material from the first alignment mark AM1.

In an embodiment, the second alignment mark AM2 may have the same plane shape as the first alignment mark AM1; however, the present invention is not limited thereto, and the second alignment mark AM2 may have a different plane shape from the first alignment mark AM1.

The second alignment mark AM2 includes a first sub-alignment mark SAM1 and a second sub-alignment mark SAM2 separated from each other by the display area DA.

The first sub-alignment mark SAM1 is positioned at a first side (e.g., upward) in the column direction, and the second sub-alignment mark SAM2 is positioned at an opposite side (e.g., downward) in the column direction.

The second organic pattern PA2 is positioned at the non-display area NDA of the substrate SUB and overlaps the second alignment mark AM2. The second organic pattern PA2 includes the same material as the first organic pattern PA1, and includes the same material as the organic material included in the plurality of organic light emitting elements OLED.

In an embodiment, the second organic pattern PA2 adjacent to the first organic light emitting element OLED1 in the column direction includes the same material as the emissive layer included in the organic emissive layer OL of the first organic light emitting element OLED1, the second organic pattern PA2 adjacent to the second organic light emitting element OLED2 in the column direction includes the same material as the emissive layer included in the organic emissive layer OL of the second organic light emitting element OLED2, and the second organic pattern PA2 adjacent to the third organic light emitting element OLED3 in the column direction includes the same material as the emissive layer included in the organic emissive layer OL of the third organic light emitting element OLED3.

That is, the first organic pattern PA1 and the second organic pattern PA2 adjacent to the first organic light emitting element OLED1 in the column direction include the same material as the emissive layer included in the organic emissive layer OL of the first organic light emitting element OLED1, the first organic pattern PA1 and the second organic pattern PA2 adjacent to the second organic light emitting element OLED2 in the column direction include the same material as the emissive layer included in the organic emissive layer OL of the second organic light emitting element OLED2, and the first organic pattern PA1 and the second organic pattern PA2 adjacent to the third organic light emitting element OLED3 in the column direction include the same material as the emissive layer included in the organic emissive layer OL of the third organic light emitting element OLED3.

The second organic pattern PA2 is positioned on the pixel definition layer PDL. The second organic pattern PA2 overlaps the second alignment mark AM2 on the pixel definition layer PDL. In an embodiment, the second organic pattern PA2 has the island shape. In an embodiment, the surface of the second organic pattern PA2 may be formed of a curved surface; however, the present invention is not limited thereto.

As described above, as the organic light emitting diode display according to an exemplary embodiment includes the first organic pattern PA1 overlapping the first alignment mark AM1 positioned at the display area DA adjacent to the plurality of organic light emitting elements OLED and including the same material as the organic material included in the organic light emitting elements OLED, and the second organic pattern PA2 overlapping the second alignment mark AM2 positioned at the non-display area NDA adjacent to the plurality of organic light emitting elements OLED and including the same material as the organic material included in the organic light emitting elements OLED, each organic emissive layer OL of the first organic light emitting element OLED1, the second organic light emitting element OLED2, and the third organic light emitting element OLED3 is aligned at the correct position on the first electrode E1.

That is, when forming each organic emissive layer OL of the first organic light emitting element OLED1, the second organic light emitting element OLED2, and the third organic light emitting element OLED3 on the first electrode E1, the first organic pattern PA1 is formed to overlap the first alignment mark AM1, and the second organic pattern PA2 is formed to overlap the second alignment mark AM2, thereby providing the organic light emitting diode display in which each organic emissive layer OL of the first organic light emitting element OLED1, the second organic light emitting element OLED2, and the third organic light emitting element OLED3 is correctly aligned on the first electrode E1.

Next, a method for manufacturing an organic light emitting diode display according to an exemplary embodiment will be described with reference to FIG. 5 to FIG. 7.

The organic light emitting diode display according to the above-described exemplary embodiment may be manufactured by using the method for manufacturing the organic light emitting diode display according to an exemplary embodiment; however, it is not limited thereto.

Figure 5:
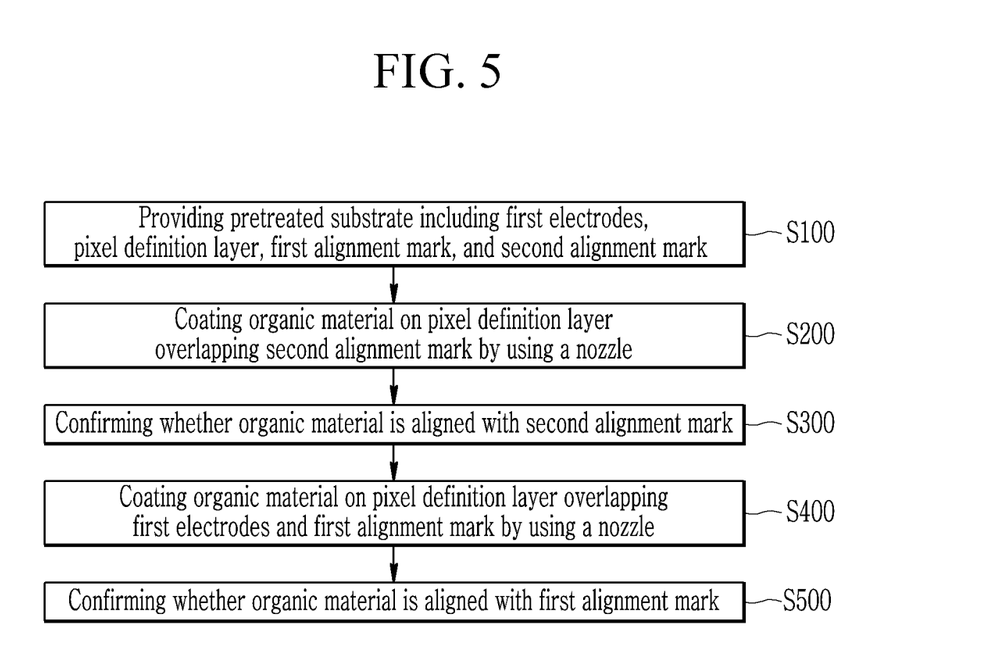
FIG. 5 is a flowchart showing a method for manufacturing an organic light emitting diode display according to an exemplary embodiment.

FIG. 5 is a flowchart showing a method for manufacturing an organic light emitting diode display according to an exemplary embodiment.

Figure 6:
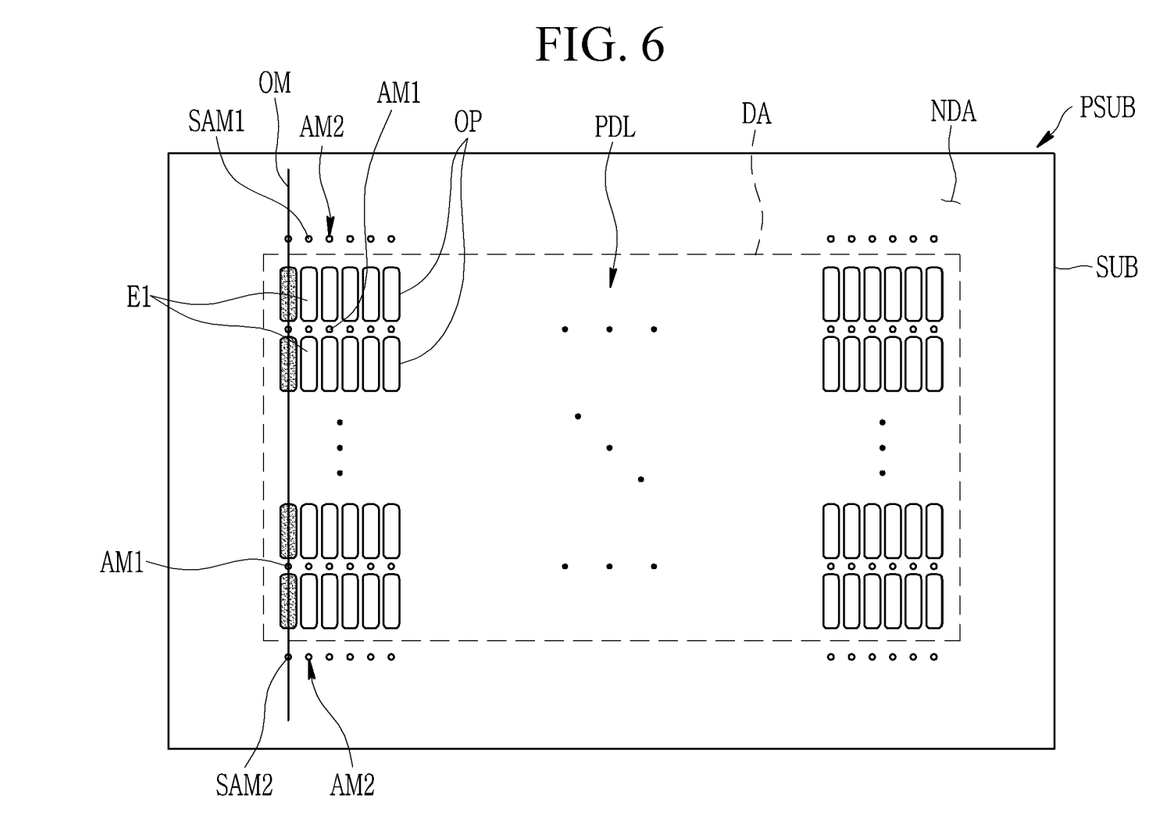
FIG. 6 and FIG. 7 are plan views to explain a method for manufacturing an organic light emitting diode display according to an exemplary embodiment.
Figure 7:
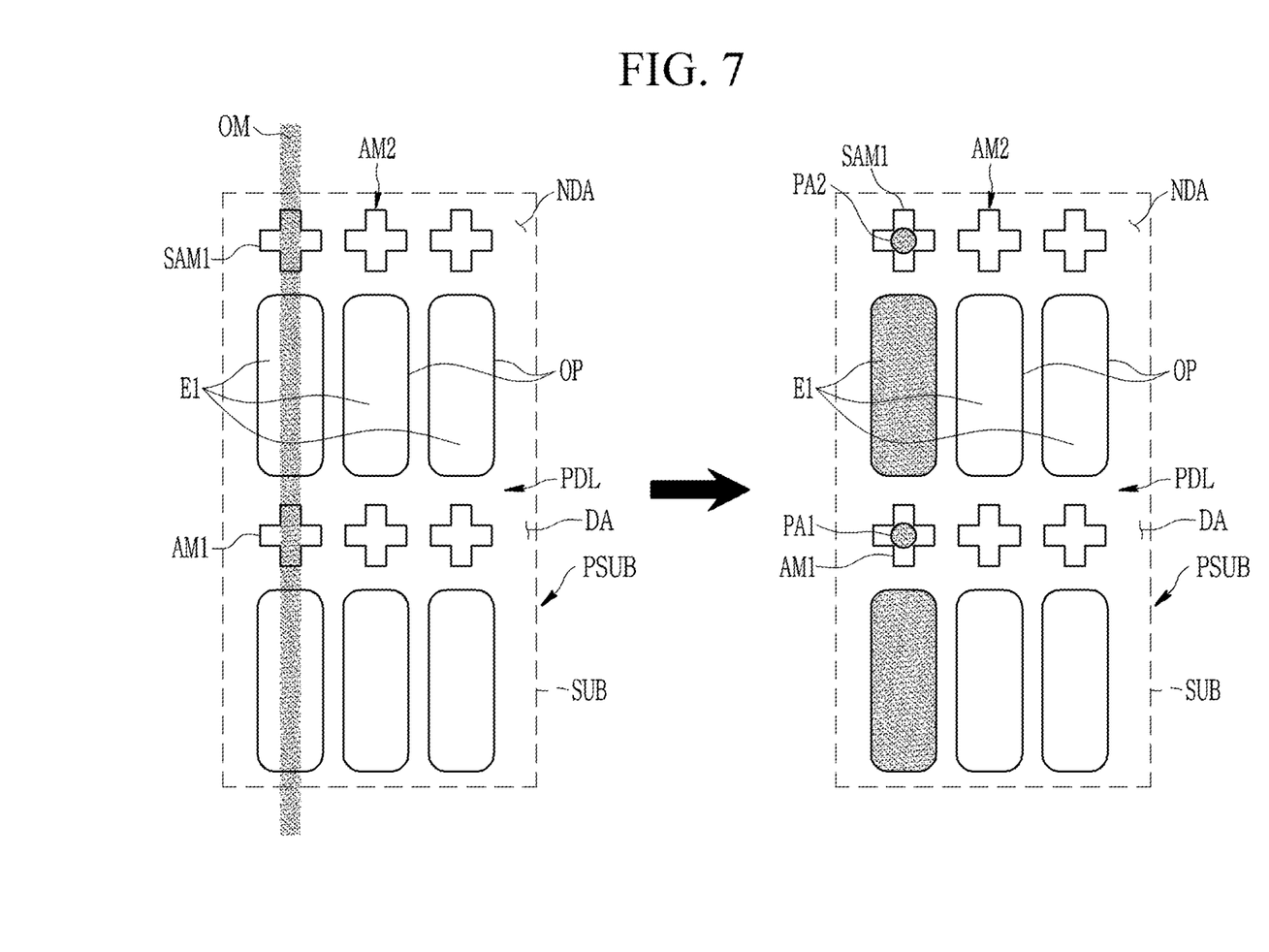

FIG. 6 and FIG. 7 are plan views to explain a method for manufacturing an organic light emitting diode display according to an exemplary embodiment.

First, referring to FIG. 5 and FIG. 6, a pretreated substrate PSUB is provided, the pretreated substrate PSUB includes a substrate SUB, a plurality of first electrodes E1 positioned on the substrate SUB, a pixel definition layer PDL including a plurality of openings OP overlapping with the plurality of first electrodes E1, a first alignment mark AM1 positioned between the plurality of openings OP, and a second alignment mark AM2 adjacent to the outermost opening OP among the plurality of openings OP (S100).

In an embodiment, the pretreated substrate PSUB includes the substrate SUB including the display area DA and the non-display area NDA, the plurality of first electrodes E1 positioned at the display area DA, the pixel definition layer PDL including the plurality of openings OP each exposing at least a part of the plurality of first electrodes E1, the first alignment mark AM1 positioned between the plurality of openings OP on the display area DA, and the second alignment mark AM2 including the first sub-alignment mark SAM1 positioned at the non-display area NDA and adjacent to an outermost opening OP at one side (e.g., an upper side) among the plurality of openings OP, and the second sub-alignment mark SAM2 adjacent to the outermost opening OP at an opposite side (e.g., a lower side) among the plurality of openings OP.

The pretreated substrate PSUB may be mounted on a stage to be movable on a plane.

Next, referring to FIG. 5 to FIG. 7, an organic material OM is coated on the pixel definition layer PDL overlapping the second alignment mark AM2 by using a nozzle (S200).

In an embodiment, as shown in FIG. 7, the organic material OM is coated on the pixel definition layer PDL overlapping the first sub-alignment mark SAM1 of the second alignment mark AM2 positioned at the non-display area NDA adjacent to the openings OP of the pixel definition layer PDL disposed in the column direction of the pretreated substrate PSUB mounted on the stage by using the nozzle moving in the column direction. The organic material OM coated from the nozzle may be coated on the pretreated substrate PSUB in a droplet or line shape.

Next, it is confirmed whether the organic material OM is aligned with the second alignment mark AM2 (S300).

In an embodiment, as shown in FIG. 7, it is confirmed whether a second organic pattern PA2 as the droplet of the organic material OM coated on the pixel definition layer PDL is aligned with the first sub-alignment mark SAM1 of the second alignment mark AM2.

If the second organic pattern PA2 is misaligned with the second alignment mark AM2, feedback may be provided to at least one of the stage and the nozzle to adjust at least one position of the stage and the nozzle.

At least one position adjustment of the stage and the nozzle may be performed by a driver including a gear, etc., connected to the stage and the nozzle, and the control of the driver may be performed by a controller connected to the driver. The driver may have any of various structures.

Also, the confirmation of whether the second organic pattern PA2 is aligned with the second alignment mark AM2 may be performed by a vision unit including a camera, etc., or by the naked eye.

Next, the organic material OM is coated on the plurality of first electrodes E1 exposed by the plurality of openings OP by using the nozzle, and the organic material OM is coated on the pixel definition layer PDL overlapping the first alignment mark AM1 (S400).

In an embodiment, as shown in FIG. 7, the organic material OM is coated on the plurality of first electrodes E1 exposed by the openings OP of the pixel definition layer PDL disposed in the column direction of the pretreated substrate PSUB mounted on the stage by using the nozzle moving in the column direction. In this case, the organic material OM is coated on the pixel definition layer PDL overlapping the first alignment mark AM1 positioned at the display area DA. The organic material OM coated from the nozzle may be coated on the pretreated substrate PSUB with a droplet shape or a line shape.

Next, it is confirmed whether the organic material OM is aligned with the first alignment mark AM1 (S500).

As shown in FIG. 7, it is confirmed whether the first organic pattern PA1 of the droplet of the organic material OM coated on the pixel definition layer PDL is aligned with the first alignment mark AM1.

If the first organic pattern PA1 is misaligned with the first alignment mark AM1, feedback may be provided to at least one of the stage and the nozzle to adjust at least one position of the stage and the nozzle.

Next, referring to FIG. 6, the organic material OM is coated on the pixel definition layer PDL overlapping the second sub-alignment mark SAM2 of the second alignment mark AM2 by using the nozzle, and it may be confirmed whether the organic material OM is aligned with the second sub-alignment mark SAM2 of the second alignment mark AM2.

Next, the organic material OM is coated on the pixel definition layer PDL overlapping the second sub-alignment mark SAM2 of the second alignment mark AM2 positioned at the non-display area NDA adjacent to the openings OP of the pixel definition layer PDL disposed in the column direction of the pretreated substrate PSUB mounted on the stage by using the nozzle moving in the column direction. Also, it is confirmed whether the second organic pattern PA2 as the droplet of the organic material OM coated on the pixel definition layer PDL is aligned with the second sub-alignment mark SAM2 of the second alignment mark AM2.

If the second organic pattern is misaligned with the second alignment mark AM2, feedback may be provided to at least one of the stage and the nozzle to adjust at least one position of the stage and the nozzle.

As described above, in the method for manufacturing the organic light emitting diode display according to an exemplary embodiment, when forming the organic emissive layer on the plurality of first electrodes E1 exposed by the openings OP of the pixel definition layer PDL by using the nozzle moving in the column direction, the second organic pattern PA2 is formed to overlap the second alignment mark AM2 positioned at the non-display area NDA, it is confirmed whether the second organic pattern PA2 is actually aligned with the second alignment mark AM2, and the organic emissive layer is formed on the plurality of first electrodes E1 by adjusting at least one position of the stage and the nozzle depending on the result thereof, thereby correctly aligning and forming the organic emissive layer on the plurality of first electrodes E1.

Also, in the method for manufacturing the organic light emitting diode display according to an exemplary embodiment, when forming the organic emissive layer on the plurality of first electrodes E1 exposed by the openings OP of the pixel definition layer PDL by using the nozzle moving in the column direction, the first organic pattern PA1 is formed to overlap the first alignment mark AM1 positioned between the adjacent openings OP, it is confirmed whether the first organic pattern PA1 is aligned with the first alignment mark AM1, and the organic emissive layer is formed on the plurality of first electrodes E1 by adjusting at least one position of the stage and the nozzle depending on the result thereof, thereby correctly aligning and forming the organic emissive layer on the plurality of first electrodes E1.

That is, in the method for manufacturing the organic light emitting diode display according to an exemplary embodiment, instead of confirming an alignment mark by the vision unit, such as the camera, and reflecting it to the position of the nozzle or the stage coating the organic material, the organic material is actually coated on the first alignment mark AM1 and the second alignment mark AM2 by using the nozzle, and it is confirmed whether each of the first organic pattern PA1 and the second organic pattern PA2 of the coated organic material is aligned with the first alignment mark AM1 and the second alignment mark AM2, and this is reflected to the position of the nozzle or the stage coating the organic material, thereby correctly aligning and forming the organic emissive layer on the plurality of first electrodes E1.

While this invention has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
   a substrate;
   a plurality of organic light emitting elements positioned on the substrate;
   a first alignment mark positioned between the plurality of organic light emitting elements; and
   a first organic pattern overlapping the first alignment mark on the substrate and including a same material as an organic material included in the plurality of organic light emitting elements.

2. The organic light emitting diode display of claim 1, wherein
   each of the plurality of organic light emitting elements includes:
   a first electrode positioned on the substrate;
   an organic emissive layer positioned on the first electrode and including the organic material; and
   a second electrode positioned on the organic emissive layer.

3. The organic light emitting diode display of claim 2, further comprising:
   a pixel definition layer covering at least a part of the first electrode and including a plurality of openings respectively overlapping with the plurality of organic light emitting elements,
   wherein the first alignment mark and the first organic pattern are positioned between the plurality of openings.

4. The organic light emitting diode display of claim 3, wherein the first alignment mark is positioned between the substrate and the pixel definition layer.

5. The organic light emitting diode display of claim 4, wherein the first alignment mark is positioned on a same layer as the first electrode.

6. The organic light emitting diode display of claim 4, further comprising:
   a thin film transistor including an active layer positioned between the substrate and the first electrode and positioned on the substrate, a gate electrode positioned on the active layer, and a source electrode and a drain electrode positioned on the gate electrode, wherein the first alignment mark is positioned on a same layer as at least one among the active layer, the gate electrode, the source electrode, and the drain electrode.

7. The organic light emitting diode display of claim 4, wherein the first organic pattern is positioned on the pixel definition layer.

8. The organic light emitting diode display of claim 1, wherein the substrate includes a display area in which the plurality of organic light emitting elements is positioned, and a non-display area adjacent to the display area, and the organic light emitting diode display further comprises:

a second alignment mark positioned at the non-display area; and a second organic pattern overlapping the second alignment mark and including the same material as the first organic pattern.

9. The organic light emitting diode display of claim 8, wherein the second alignment mark includes a first sub-alignment mark and a second sub-alignment mark separated from each other by the display area.

10. The organic light emitting diode display of claim 8, wherein the first alignment mark and the second alignment mark have a same shape in a plane.

11. A method for manufacturing an organic light emitting diode display, the method comprising:

providing a pretreated substrate including a substrate, a plurality of first electrodes of a plurality of organic light emitting elements positioned on the substrate, a pixel definition layer including a plurality of openings overlapping with the plurality of first electrodes, and a first alignment mark positioned between the plurality of openings so as to be positioned between the plurality of organic light emitting elements;

coating an organic material included in the plurality of organic light emitting elements on the plurality of first electrodes exposed by the plurality of openings by using a nozzle, and coating the organic material on the pixel definition layer overlapping the first alignment mark on the substrate and including a same material as the organic material included in the plurality of organic light emitting elements; and confirming whether the organic material is aligned with the first alignment mark.

12. The method of claim 11, further comprising adjusting a position of the nozzle.

13. The method of claim 11, wherein the substrate includes a display area where the plurality of first electrodes is positioned, and a non-display area adjacent to the display area, the pretreated substrate further includes a second alignment mark positioned at the non-display area, and the method further comprises:

coating the organic material on the pixel definition layer overlapping the second alignment mark by using the nozzle; and confirming whether the organic material is aligned with the second alignment mark.

\* \* \* \* \*